United States Patent
Mikhemar et al.

(10) Patent No.: US 9,246,438 B2
(45) Date of Patent: Jan. 26, 2016

(54) RECEIVER ARCHITECTURE FOR A COMPACT AND LOW POWER RECEIVER

(71) Applicant: BROADCOM CORPORATION, Irvine, CA (US)

(72) Inventors: Mohyee Mikhemar, Aliso Viejo, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/817,150

(22) Filed: Aug. 3, 2015

(65) Prior Publication Data
US 2015/0340994 A1    Nov. 26, 2015

Related U.S. Application Data

(62) Division of application No. 13/719,125, filed on Dec. 18, 2012, now Pat. No. 9,130,600.

(51) Int. Cl.
*H04B 1/18* (2006.01)
*H03F 1/02* (2006.01)
*H03F 1/56* (2006.01)
*H03F 3/19* (2006.01)
*H03F 3/21* (2006.01)

(52) U.S. Cl.
CPC .............. *H03F 1/0205* (2013.01); *H03F 1/565* (2013.01); *H03F 3/19* (2013.01); *H03F 3/211* (2013.01); *H04B 1/18* (2013.01); *H03F 2200/294* (2013.01); *H03F 2200/451* (2013.01); *H03F 2203/21106* (2013.01)

(58) Field of Classification Search
CPC ......... H03F 3/087; H03F 3/082; H03F 1/086; H03F 3/08; H03F 3/45179; H03F 3/3022; H03F 3/45183; H03F 1/26; H03F 2203/45644; H03F 1/0205; H03F 1/42; H03F 2200/216; H03F 2200/294; H03F 2200/36; H03F 2203/30031
USPC ..................................................... 455/193.1
See application file for complete search history.

(56) References Cited

U.S. PATENT DOCUMENTS

| 8,761,307 B1 * | 6/2014 | Ionescu | ............... H04L 1/0057 375/316 |
| 2008/0007336 A1 * | 1/2008 | Belot | ..................... H04B 1/30 330/250 |

* cited by examiner

*Primary Examiner* — Ajibola Akinyemi
(74) *Attorney, Agent, or Firm* — McDermott Will & Emery LLP

(57) ABSTRACT

A circuit for a receiver with reconfigurable low-power or wideband operation may comprise one or more main signal paths each coupled to a first port and including a low-noise amplifier (LNA) configured to provide a radio frequency (RF) signal to a main mixer circuit. An auxiliary signal path may be coupled to a second port. The auxiliary signal path may include an auxiliary mixer configured to provide an on-chip matching input impedance that may match an impedance of the antenna. The first port may be coupled to an RF antenna through an off-chip matching circuit, when a low-power operation is desired. The first port may be coupled to the second port and to the RF antenna, when a wideband operation is desired.

20 Claims, 6 Drawing Sheets

RECEIVER ARCHITECTURE FOR A COMPACT AND LOW POWER RECEIVER

CROSS-REFERENCE TO RELATED APPLICATIONS

This application is a divisional application of the U.S. patent application Ser. No. 13/719,125 filed Dec. 18, 2012, which is incorporated herein by reference in its entirety.

TECHNICAL FIELD

The present description relates generally to radio frequency (RF) communications, and more particularly, but not exclusively, to a receiver architecture with reconfigurable on-chip matching for wideband operation and off-chip matching for low-power operation.

BACKGROUND

As the number of wireless standards and the range of frequencies of wireless communications continue to increase, there is an increasing need for communication receivers that are capable of handling multiple wireless standards spanning a wide range of frequencies. Also, as the number of wireless devices and the amount of wireless communications taking place increase, the communication receivers may have to be able to function satisfactorily in the presence of large amounts of noise and interference.

Further, the multitude of battery operated wireless devices has created a demand for extremely low-power transceivers to increase the handset talk time and to reduce the battery size and ultimately the cost. Meanwhile, the noise and linearity requirements are becoming more stringent to meet the quest for higher data rates with a highly congested spectrum. Typically, implementing low-noise receivers may become more challenging when the design objectives also include reconfigurable low-power consumption or wideband operation, and size reduction.

Therefore, the need exists for a low noise receiver that is reconfigurable for low-power or wideband operation, and can be implemented on a smaller chip area.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1A:
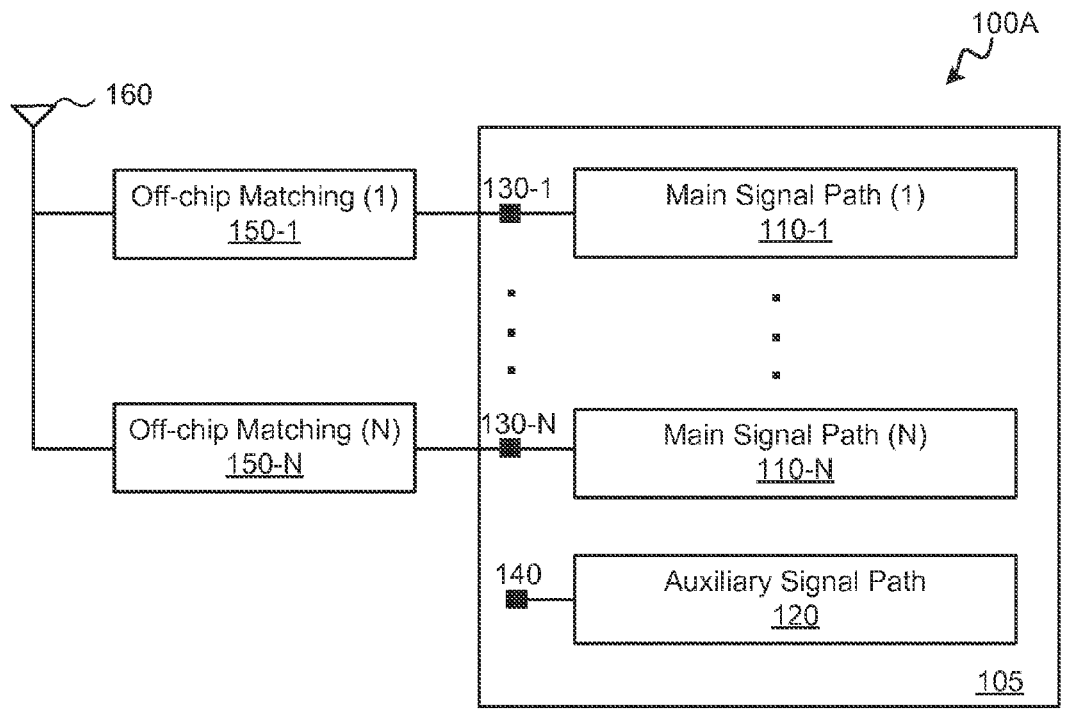
FIGS. 1A-1E illustrate examples of receiver architecture with configurable wideband and low-power operation in accordance with one or more implementations.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

FIGS. 1A-1E illustrate examples of receiver architecture 100A and 100B with configurable low-power and wideband operation in accordance with one or more implementations of the subject technology. The receiver architecture 100A may include one or more (e.g., N, such as four) main signal paths 110 (e.g., 110-1 to 110-N) coupled to first ports 130 (e.g., on-chip pins 130-1 to 130-N) and an auxiliary signal path 120 coupled to a second port 140 provided on a chip 105. The receiver architecture 100A may include a multi-band receiver, and the main signal paths 110 may include signal paths corresponding to multiple frequency bands of the multi-band receiver. The auxiliary signal path 120 may provide an input impedance that can match an impedance of a radio-frequency (RF) antenna 160 (e.g., 50Ω) over a wide range of frequency. In one or more aspects of the subject technology, the main path may provide an output signal that can be used to reduce or cancel noise of the auxiliary signal path 120.

The main signal paths 110 and the auxiliary path 120 may provide a configurable receiver architecture that can be configured for low-power or wideband operation. For example, in one or more implementations, one or more main signal paths 110 may be coupled through one or more off-chip matching circuits 150 (e.g., 150-1 to 150-N) to the RF antenna 160 to provide a low-power receiver architecture (e.g., a cell phone receiver). In another implementation, the receiver architecture 100B shown in FIG. 1B, may leverage the wideband impedance matching of the auxiliary signal path 120, to replace the one or more off-chip matching circuits 150. In the receiver architecture 100B, one or more ports 130 may be connected (e.g., off-chip) to the port 140 and the RF antenna 160. It is understood that the selection of the low-power or the wideband operation may be advantageously performed upon using the chip 105. In other words, the chip 105 can be configured as a low power receiver or a wideband receiver by a user of the chip 105. The low-power mode may be suitable for bands where an external off-chip filter is needed to filter the out of band blockers. In such configuration multiple RF ports (130-1 to 130-N) may be used to interface the receiver with multiple RF filters.

Figure 1B:
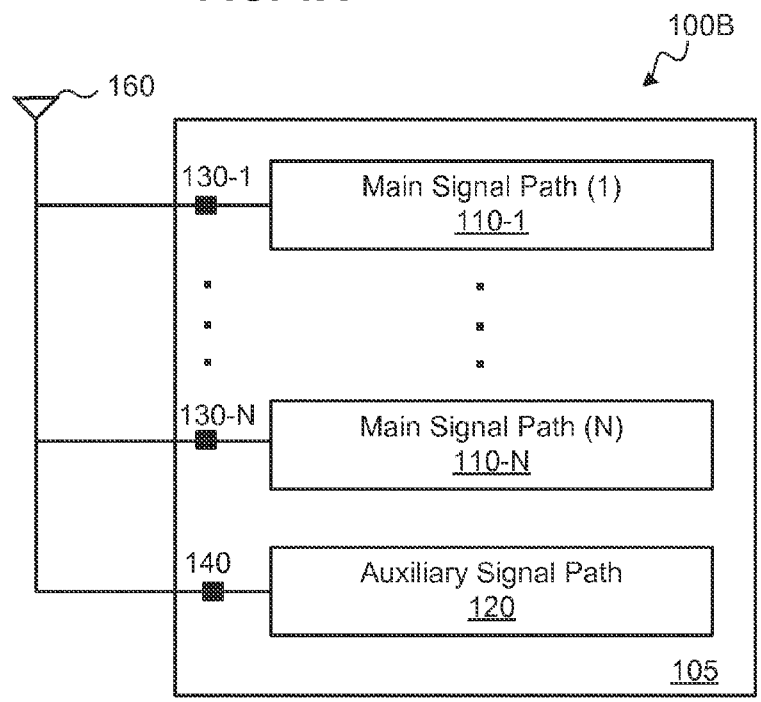
Figure 1C:
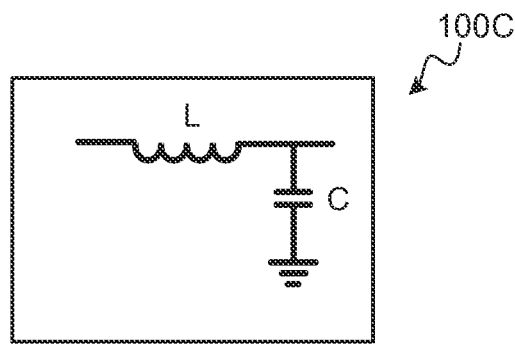

In one or more implementations, the off-chip matching circuit 150, as shown in FIG. 1C, may include an LC circuit 100C (e.g., an LC filter) including an inductor L (e.g., with inductance L) and a capacitor C (e.g., with capacitance C). The LC circuit 100C may be provided externally, and values of L and C may be selected based on the frequency band of interest. The LC circuit 100C may be configured to provide a matching resistive input impedance (e.g. 50Ω), when coupled to one or more main signal path 110. It is understood that the off-chip matching circuit 150 may not be restricted to the LC circuit 100C, and may be implemented by other circuits.

Figure 1D:
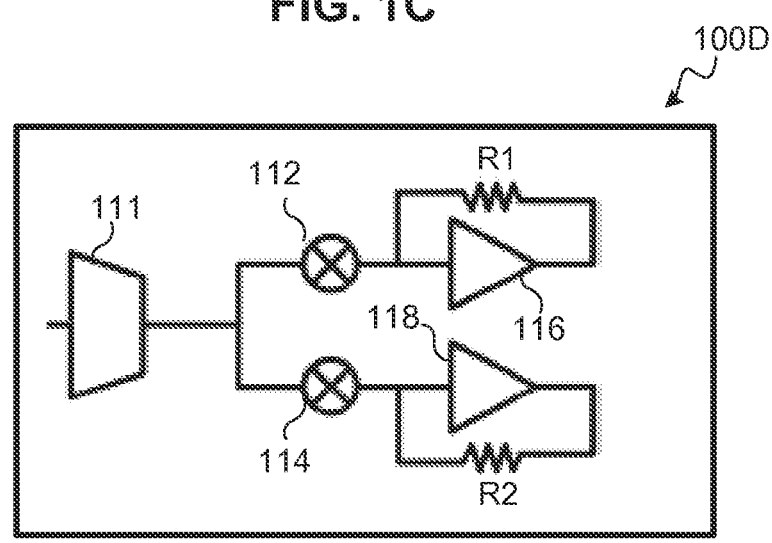

FIG. 1D illustrates an example circuit 100D representing the main signal path 110 of FIGS. 1A and 1B in accordance with one or more implementations of the subject technology. The circuit 100D may include a low-noise amplifier (LNA) 111, such as a trans-conductance LNA that can provide a suitable gain at a low noise figure (e.g., 2 dB) for the RF signal received from the RF antenna 160 of FIGS. 1A and 1B. The RF signal from the LNA 111 may be down-converted by a quadrature mixer formed by a in-phase (I) channel mixer 112 and a quadrature-phase (Q) channel mixer 114 to baseband signals (or an intermediate frequency (IF) signal, in heterodyne receiver architectures), provided to respective I and Q channel feedback trans-impedance amplifiers (TIAs) 116 and 118 (e.g., TIA buffers). The TIAs 116 and 118 may include resistors R1 and R2 in their respective feedback loops. The LNA, the quadrature mixer, and the TIA are know in the art and, for the sake of brevity, their description is skipped herein. It is understood that the main signal path 110 may not be restricted to the circuit 100D, and may be implemented by other circuits.

Figure 1E:
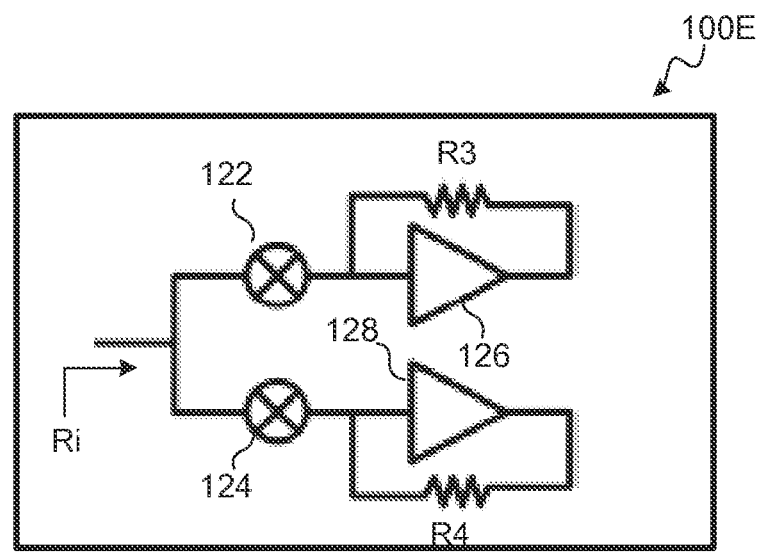

FIG. 1E illustrates an example circuit 100E representing the auxiliary signal path 120 of FIGS. 1A and 1B in accordance with one or more implementations of the subject technology. The circuit 100E may include I and Q channel mixers 122 and 124 and resistive feedback TIAs 126 and 128 with resistors R3 and R4 in their feedback loops. The circuit 100E may be combined by one or more main signal paths 110 (e.g. circuit 100D of FIG. 1D) to provide an input impedance Ri that matches the impedance of the antenna 160 of FIGS. 1A and 1B (e.g., Ri=50Ω). Further, the output signals from the circuit 100E may be used to reduce or cancel the noise from the main signal path 110.

It is understood that the auxiliary signal path 120 may not be restricted to the circuit 100E, and may be implemented by other circuits. In one or more implementations, coupling of the circuit 100E to the one or more main signal paths 110 (e.g. circuit 100D) may be performed by one or more on-chip switches that can be operable by a user of the chip 105 of FIG. 1B. In other words, the user of the chip 105, instead of coupling one or more ports 130 to port 140 externally, may be able to make the coupling through closing the one or more on-chip switches.

Figure 2A:
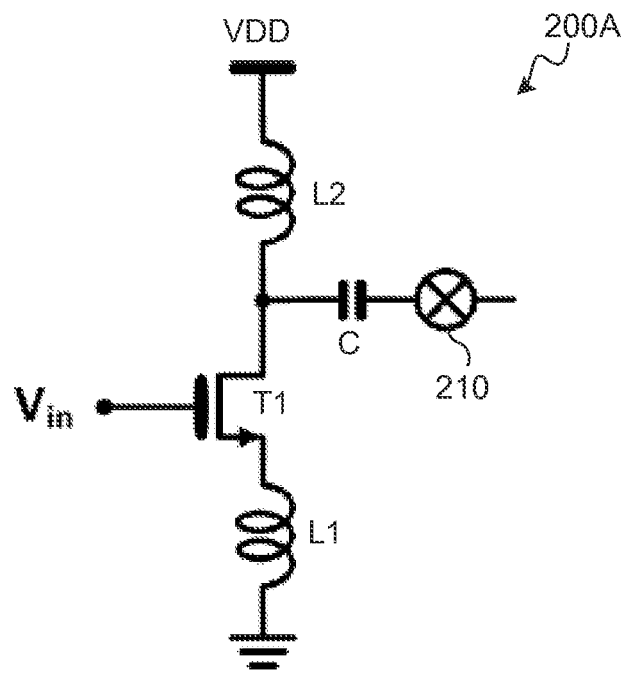
FIG. 2A-2B illustrate examples of low-noise amplifiers (LNAs) with and without inductor degeneration in accordance with one or more implementations.

FIG. 2A illustrates an example of a circuit 200A for a conventional LNA with inductor degeneration. An LNA circuit is typically a first block of a receiver circuit and it is known that the noise figure (NF) of the first stage dominates the overall NF of the receiver. Furthermore, maximum power transfer at input and output nodes of the LNA circuit can be achieved by matching the input impedance and output impedance of the LNA circuit with the impedance of the previous stage (e.g., the antenna, such as antenna 160 of FIG. 1A) and a next stage (e.g., coupling capacitor C and mixer 210).

One way to match the input resistance of the LNA circuit with the impedance of the antenna (e.g., 50Ω) may include the use of inductor degeneration. For example, in the LNA circuit 200A, inductor degeneration may be achieved by an inductor L1 coupled between the source node of an NMOS transistor T1 and ground potential. The input impedance of the LNA circuit 200A may be defined in terms of the values of the inductance L1, trans-conductance parameter (e.g., $g_m$) of transistor T1 and a gate-source capacitance ($C_{GS}$) between the gate and source nodes of the transistor T1. Therefore, the impedance matching at the input of the LNA circuit 200A may be achieved by selection of suitable values for L1, $g_m$, and $C_{GS}$.

Further, in order to match the output impedance of the LNA circuit 200A to a load (e.g., coupling capacitor C and mixer 210) a load inductor L2 may be coupled between the drain node of the transistor T1 and a supply voltage $V_{DD}$. Creating inductors L1 and L2 on chip (e.g., on the chip 105 of FIG. 1A) may take a substantially large area. The disclosure herein may provide a circuit configuration where the input and output impedance matching can be performed without the use of the inductors L1 and L2, therefore significantly reducing the area and power consumption of the LNA circuit.

Figure 2B:
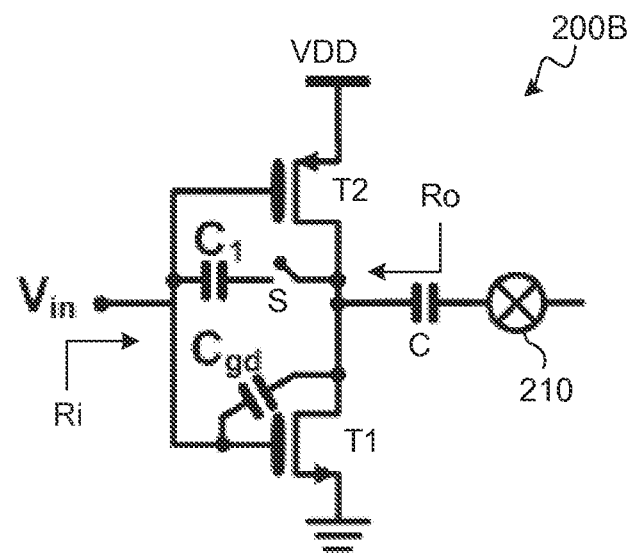

FIG. 2B illustrate an example of an LNA circuit 200B without inductor degeneration in accordance with one or more implementations the subject technology. The LNA circuit 200B includes a complementary inverter-based LNA, where the role of the inductors L1 and L2 of the LNA circuit 200A of FIG. 2A, in input and output impedance matching, can be advantageously performed by intrinsic and on-chip capacitances; thereby resulting in a significant saving in chip area and power consumption. The LNA circuit 200B includes a complementary MOS (CMOS) inverter formed by an NMOS transistor T1 and a PMOS transistor T2. The complementary configuration may support a reduction of approximately 50% in power consumption. This is because the LNA circuit 200B can benefit from the gains corresponding to both NMOS and PMOS stages, which can be viewed as two common-source amplifier stages coupled together. Stated differently, the LNA circuit 200B can provide the same output signal power, as compared to a single transistor LNA (e.g., LNA circuit 200A) with approximately 50% lower bias current.

The chip area reduction is the result of replacement of on-chip inductors L1 and L2 of the LNA circuit 200A. In the proposed LNA circuit 200B, the input impedance matching may be performed by the intrinsic gate-drain capacitance $C_{gd}$ of the transistors T1 and T2. In one or more implementations, an additional on-chip capacitor C1 may be used, which can be added to the intrinsic capacitance $C_{gd}$ via an on-chip switch S. The role of the capacitance $C_{gd}$ as a drain-to-gate feedback capacitance in the input impedance of the LNA circuit 200B is determined by the Miller-effect of the capacitance $C_{gd}$ (and C1). The Miller effect may result in a Miller input impedance by bringing a portion of the output impedance (e.g., the impedance seen from the gate nodes of transistors T1 and T2) to the input port (e.g., gate node of the transistors T1 and T2) of the LNA circuit 200B. The miller input impedance and the Miller output impedance (e.g., the effective impedance seen from the drain nodes of transistors T1 and T2) may depend on parameters of the transistors T1 and T2, for example, the trans-conductance parameter (e.g., $g_m$) and the gate-drain parasitic capacitance $C_{gd}$, both of which can be adjusted by design. Therefore, the values of $C_{gd}$ and $g_m$ of transistor T1 and T2 may be adjusted (for example, by suitable design of the size and the gate-drain junctions of transistors T1 and T2) to provide a desired input impedance Ri (e.g., 50Ω) at the input of the LNA circuit 200B and a desired output impedance Ro at the output node (e.g., drain nodes of T1 and T2) of the LNA circuit 200B, without using the inductors L1 and L2 of LNA circuit 200A. The additional on-chip capacitor C1 may be added, as needed, via the switch S, to boost the effect of the intrinsic capacitance $C_{gd}$ for further adjustments. Further, the use of a programmable variable capacitance C1 may provide a tunable matching which can be programmable.

Figure 3A:
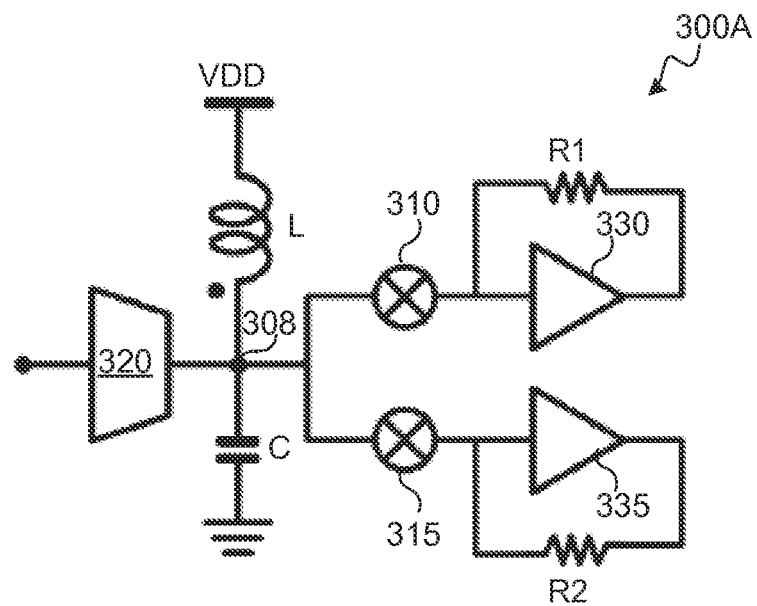
FIG. 3A-3B illustrate examples of receiver circuits with and without LNA load inductor in accordance with one or more implementations.
Figure 3B:
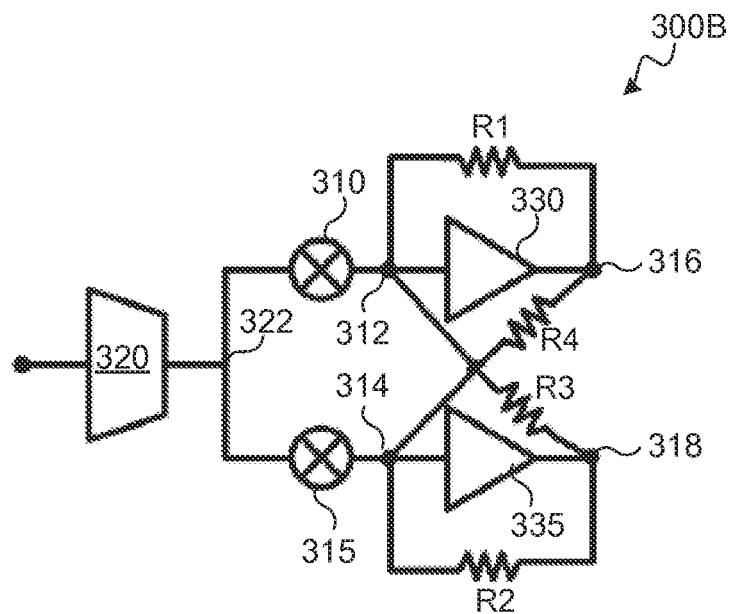

FIG. 3A illustrates an example of a conventional receiver circuit 300A with an LNA load inductor L1. The receiver circuit 300A includes an LNA 320 such as a trans-conductance LNA, I and Q channel mixer circuits 310 and 315, and feedback TIAs 330 and 335 with resistors R1 and R2 in their respective feedback loops. Also included in the LNA circuit 300A are an inductor load L (e.g., having an inductance L) and a capacitor C (e.g., having a capacitance C). The capacitor C may include an equivalent capacitance seen at node 308 (e.g., an input capacitance of the mixer circuits 310 and 315 in parallel with the output capacitance of LNA 320), which can FIG. 3B illustrates an example of a receiver circuit 300B without the LNA load inductor L of the receiver circuit 300A of FIG. 3A in accordance with one or more implementations of the subject technology. In the receiver circuit 300B, the LNA 320, I and Q channel mixers 310 and 315, feedback TIAs 330 and 335, and feedback resistors R1 and R2 are the same as in the receiver circuit 300A of FIG. 3A. In the receiver circuit 300B, the role of the bulky inductor L is played by first and second cross-coupling resistors R3 and R4 that cross couple TIAs 330 and 335. The first cross coupled-resistor R3 may be coupled between an input node 312 of the TIA 330 and an output node 318 of the TIA 335, and the second cross coupled-resistor R4 may be coupled between an input node 314 of the TIA 335 and an output node 316 of the TIA 330.

The cross-coupled resistors R3 and R4 may contribute to complex input impedances seen from nodes 312 and 314, which once up-converted and seen from node 322 can be viewed as an effective inductive impedance (e.g., jx, with a positive imaginary portion x). The values of the resistances R3 and R4 can be adjusted so that the effective inductive impedance at node 322 can be tuned to the equivalent capacitance C seen at node 308 of FIG. 3A. For example, the resistances R3 and R4 may be variable resistances and by adjusting the value of the variable resistances R3 and R4, tuning to frequencies corresponding to multiple frequency bands of the receiver 300B can be performed. It is understood that in the receiver circuit 300A, tuning to the multiple frequency bands may involve using multiple load inductors with different inductance values. Therefore, the present disclosure provides a substantial chip-area reduction by replacing the role of the multiple load inductors with two variable resistors (e.g, R3 and R4).

Figure 4:
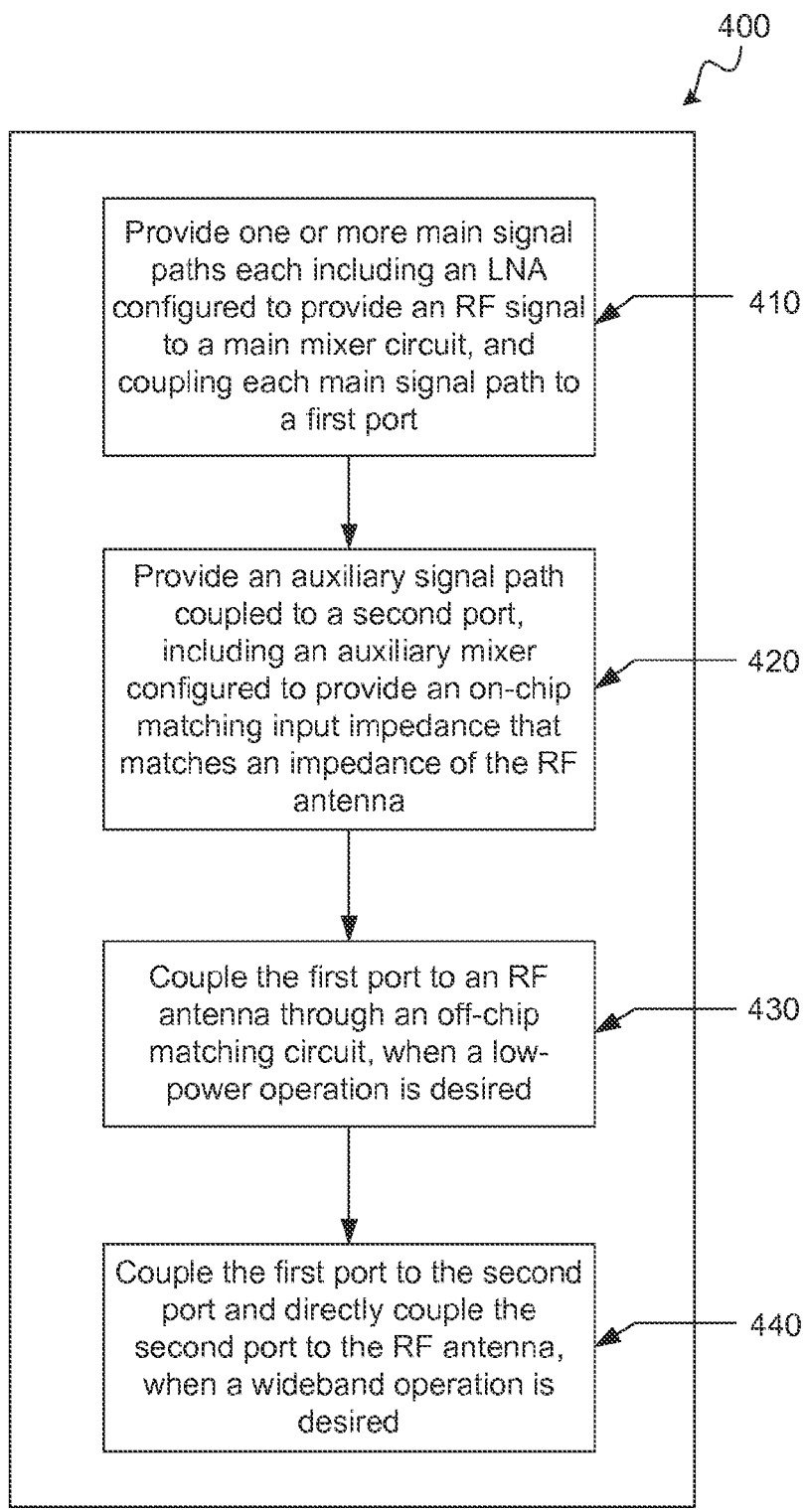
FIG. 4 illustrates an example method for providing a receiver architecture with configurable wideband and low-power operation in accordance with one or more implementations.

FIG. 4 illustrates an example method 400 for providing a receiver architecture with configurable wideband and low-power operation in accordance with one or more implementations of the subject technology. For explanatory purposes, the example method 400 is described herein with reference to the low-power receiver architecture 100A of FIG. 1A, the wideband receiver architecture 100B of FIG. 1B, the circuit 100D of FIG. 1D, and the circuit 100E of FIG. 1E; however, the example method 400 is not limited to the low-power receiver architecture 100A, wideband receiver architecture 100B, the circuit 100D, and the circuit 100E. Further for explanatory purposes, the blocks of the example method 400 are described herein as occurring in serial, or linearly. However, multiple blocks of the example method 400 may occur in parallel. In addition, the blocks of the example method 400 need not be performed in the order shown and/or one or more of the blocks of the example method 400 need not be performed.

At operation block 410, one or more main signal paths 110 may be provided. Each main signal path (e.g., 110 of FIGS. 1A and 1B and 100D of FIG. 1D) may include a low-noise amplifier (LNA) (e.g., 111 of FIG. 1D) configured to provide a radio frequency (RF) signal to a main mixer circuit (e.g., a quadrature mixer formed by I and Q channel mixers 112 and 114 of FIG. 1D). Each main signal path may be coupled to a first port (e.g., 130 of FIG. 1A). At operation block 420, an auxiliary signal path (e.g., 120 of FIGS. 1A and 1B and 100E of FIG. 1E) may be provided and coupled to a second port (e.g., 140 of FIGS. 1A and 1B). The auxiliary signal path may include an auxiliary mixer (e.g., a quadrature mixer formed by I and Q channel mixers 122 and 124 of FIG. 1E) that may be configured to provide an on-chip matching input imped-ance (e.g., Ri of FIG. 1E) that can match an impedance of the RF antenna (e.g., 160 of FIGS. 1A and 1B). The first port may be coupled to the RF antenna through an off-chip matching circuit 150, when a low-power operation is desired (operation block 430). At operation block 440, the first port may be coupled to the second port and the second port may be directly coupled to the RF antenna, when a wideband operation is desired.

In one or more implementation, the receiver architecture with configurable wideband and low-power operation of FIGS. 1A and 1B may be realized in a wireless communication device described below.

Figure 5:
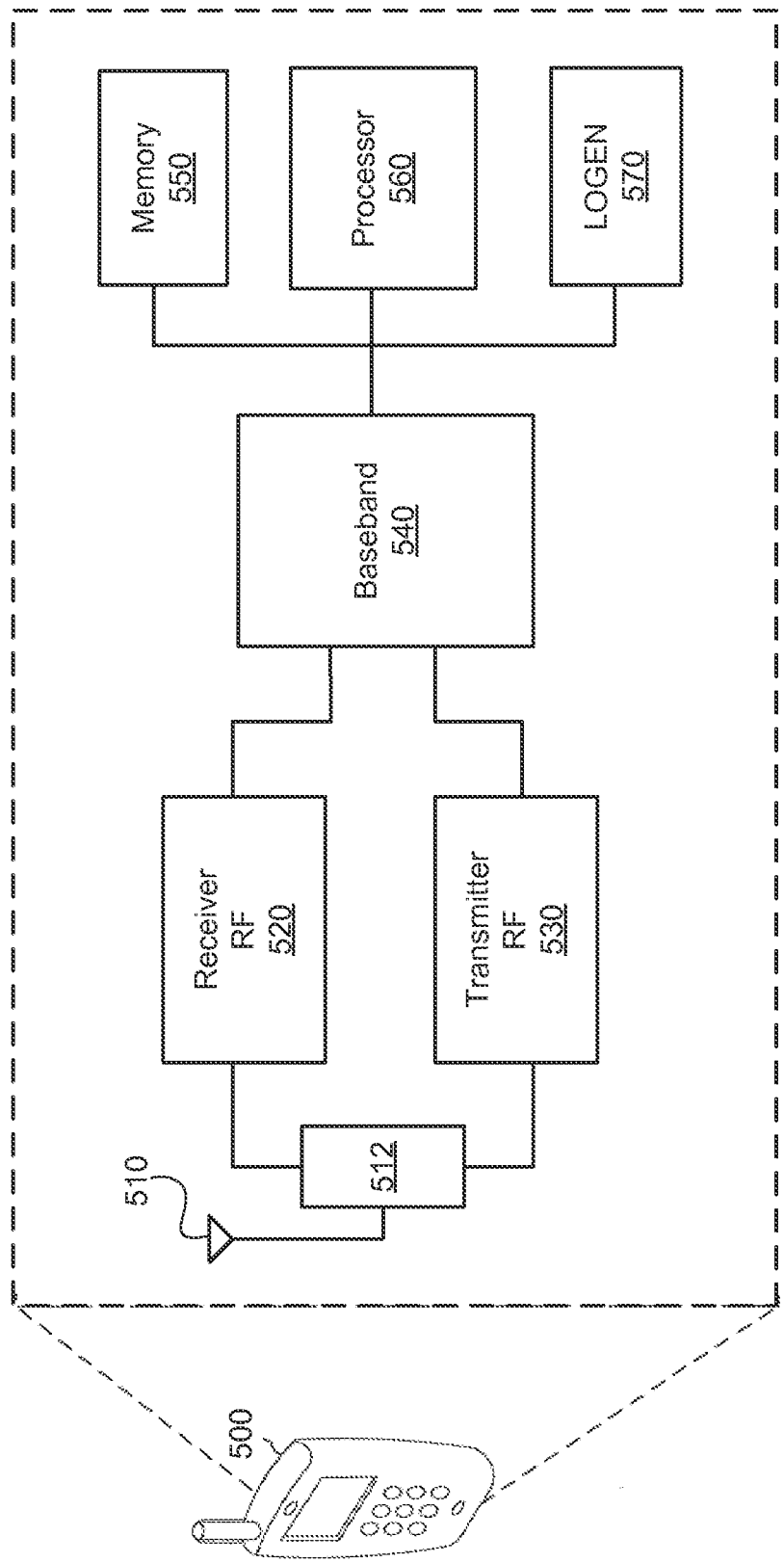
FIG. 5 illustrates an example wireless communication device in accordance with one or more implementations.

FIG. 5 illustrates an example wireless communication device 500 in accordance with one or more implementations of the subject technology. The wireless communication device 500 may comprise a radio-frequency (RF) antenna 510, a receiver 520, a transmitter 530, a baseband processing module 540, a memory 550, a processor 560, and a local oscillator generator (LOGEN) 570. In various embodiments of the subject technology, one or more of the blocks represented in FIG. 5 may be integrated on one or more semiconductor substrates. For example, the blocks 520-570 may be realized in a single chip or a single system on chip, or may be realized in a multi-chip chipset.

The RF antenna 510 may be suitable for transmitting and/or receiving RF signals (e.g., wireless signals) over a wide range of frequencies. Although a single RF antenna 510 is illustrated, the subject technology is not so limited.

The receiver 520 may comprise suitable logic circuitry and/or code that may be operable to receive and process signals from the RF antenna 510. The receiver 520 may, for example, be operable to amplify and/or down-convert received wireless signals. In various embodiments of the subject technology, the receiver 520 may be operable to cancel noise in received signals and may be linear over a wide range of frequencies. In this manner, the receiver 520 may be suitable for receiving signals in accordance with a variety of wireless standards. Wi-Fi, WiMAX, Bluetooth, and various cellular standards. In various embodiments of the subject technology, the receiver 520 may not require any SAW filters and few or no off-chip discrete components such as large capacitors and inductors.

The transmitter 530 may comprise suitable logic circuitry and/or code that may be operable to process and transmit signals from the RF antenna 510. The transmitter 530 may, for example, be operable to up-convert baseband signals to RF signals and amplify RF signals. In various embodiments of the subject technology, the transmitter 530 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 530 may be operable to provide signals for further amplification by one or more power amplifiers.

The duplexer 512 may provide isolation in the transmit band to avoid saturation of the receiver 520 or damaging parts of the receiver 520, and to relax one or more design requirements of the receiver 520. Furthermore, the duplexer 512 may attenuate the noise in the receive band. The duplexer may be operable in multiple frequency bands of various wireless standards.

The baseband processing module 540 may comprise suitable logic, circuitry, interfaces, and/or code that may be operable to perform processing of baseband signals. The baseband processing module 540 may, for example, analyze received signals and generate control and/or feedback signals for configuring various components of the wireless communication device 500 such as the receiver 520. The baseband processing module 540 may be operable to encode, decode, transcode, modulate, demodulate, encrypt, decrypt, scramble, descramble, and/or otherwise process data in accordance with one or more wireless standards.

The processor 560 may comprise suitable logic, circuitry, and/or code that may enable processing data and/or controlling operations of the wireless communication device 500. In this regard, the processor 560 may be enabled to provide control signals to various other portions of the wireless communication device 500. The processor 560 may also control transfers of data between various portions of the wireless communication device 500. Additionally, the processor 560 may enable implementation of an operating system or otherwise execute code to manage operations of the wireless communication device 500.

The memory 550 may comprise suitable logic, circuitry, and/or code that may enable storage of various types of information such as received data, generated data, code, and/or configuration information. The memory 550 may comprise, for example, RAM, ROM, flash, and/or magnetic storage. In various embodiment of the subject technology, Information stored in the memory 550 may be utilized for configuring the receiver 520 and/or the baseband processing module 540.

The local oscillator generator (LOGEN) 570 may comprise suitable logic, circuitry, interfaces, and/or code that may be operable to generate one or more oscillating signals of one or more frequencies. The LOGEN 570 may be operable to generate digital and/or analog signals. In this manner, the LOGEN 570 may be operable to generate one or more clock signals and/or sinusoidal signals. Characteristics of the oscillating signals such as the frequency and duty cycle may be determined based on one or more control signals from, for example, the processor 560 and/or the baseband processing module 540.

In operation, the processor 560 may configure the various components of the wireless communication device 500 based on a wireless standard according to which it is desired to receive signals. Wireless signals may be received via the RF antenna 510 and amplified and down-converted by the receiver 520. The baseband processing module 540 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 550, and/or information affecting and/or enabling operation of the wireless communication device 500. The baseband processing module 540 may modulate, encode and perform other processing on audio, video, and/or control signals to be transmitted by the transmitter 530 in accordance to various wireless standards.

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A circuit for a compact and low power receiver, the circuit comprising:
   a low-power low-noise amplifier (LNA) configured to amplify radio-frequency (RF) signals received from an RF antenna; and
   a quadrature mixer coupled to a first and a second transimpedance amplifiers (TIAs), wherein:
      input and output nodes of the first and the second TIAs are cross-coupled via a first and a second resistor, and
      the cross coupling is configured to create a complex impedance that replaces one or more LNA load inductors corresponding to one or more frequency bands of the receiver.

2. The circuit of claim 1, wherein the input and out nodes of the first cross coupled TIA are coupled to output and input nodes of the second cross coupled TIA, via the first and the second resistors, respectively.

3. The circuit of claim 1, wherein the created complex impedance is configured to replace the one or more LNA load inductors and to result in a substantial chip area reduction.

4. The circuit of claim 1, wherein the low power LNA comprises a complementary inverter-based LNA with no degeneration inductors.

5. The circuit of claim 4, wherein impedance matching is provided through one or more feedback capacitances including at least one of a parasitic capacitance or an additional on-chip feedback capacitance.

6. The circuit of claim 5, wherein the additional on-chip feedback capacitance is implemented parallel to the parasitic capacitance, and wherein the parasitic capacitance comprises a parasitic gate-drain capacitances.

7. The circuit of claim 5, wherein the low power LNA comprises a complementary inverter-based LNA, and wherein the parasitic capacitance comprises at least one of a parasitic gate-drain capacitance of NMOS or PMOS transistors of the complementary inverter-based LNA.

8. The circuit of claim 5, wherein the impedance matching comprises tunable matching and is provided through one or more programmable feedback capacitances.

9. The circuit of claim 1, wherein the LNA comprises a complementary inverter-based LNA, wherein the complementary inverter-based LNA is implemented on a substantially smaller area and is configured to consume approximately 50% less power, as compared to an inductor degenerated LNA.

10. A method for providing a compact and low power receiver, the method comprising:
   providing a low-power low-noise amplifier (LNA);
   configured the LNA to amplify radio-frequency (RF) signals received from an RF antenna;
   coupling a quadrature mixer to a first and a second transimpedance amplifiers (TIAs);
   cross coupling input and output nodes of the first and the second TIAs via a first and a second resistor; and
   configuring the cross coupling to create a complex impedance that replaces one or more LNA load inductors corresponding to one or more frequency bands of the compact and low power receiver.

11. The method of claim 10, further comprising coupling the input and out nodes of the first cross coupled TIA to output and input nodes of the second cross coupled TIA, via the first and the second resistors, respectively.

12. The method of claim 10, further comprising configuring the created complex impedance to substantially reduce chip area by replacing the one or more LNA load inductors.

13. The method of claim 10, further comprising implementing the low power LNA using a complementary inverter-based LNA with no degeneration inductors.

14. The method of claim 13, further comprising providing impedance matching through one or more feedback capacitances including at least one of a parasitic capacitance or an additional on-chip feedback capacitance.

15. The method of claim 14, further comprising implementing the additional on-chip feedback capacitance parallel to the parasitic capacitance, and wherein the parasitic capacitance comprises a parasitic gate-drain capacitances.

16. The method of claim 15, further comprising implementing the low power LNA using a complementary inverter-based LNA, and wherein the parasitic capacitance comprises at least one of a parasitic gate-drain capacitance of NMOS or PMOS transistors of the complementary inverter-based LNA.

17. The method of claim 10, further comprising providing impedance matching through a tunable matching provided through one or more programmable feedback capacitances.

18. The method of claim 10, further comprising:
   implementing the low power LNA using a complementary inverter-based LNA; and
   implementing the complementary inverter-based LNA on a substantially smaller area,
   wherein the complementary inverter-based LNA is configured to consume approximately 50% less power, as compared to an inductor degenerated LNA.

19. A communication device comprising:
   an radio-frequency (RF) antenna; and
   a compact and low power receiver coupled to the RF antenna, the receiver comprising:
      a low-power low-noise amplifier (LNA) configured to amplify RF signals received from the RF antenna; and
      a quadrature mixer coupled to a first and a second transimpedance amplifiers (TIAs),
      wherein:
      input and output nodes of the first and the second TIAs are cross-coupled via a first and a second resistor, and
      the cross coupling is configured to create a complex impedance that replaces one or more LNA load inductors corresponding to one or more frequency bands of the receiver.

20. The communication device of claim 19, wherein:
   the input and out nodes of the first cross coupled TIA are coupled to output and input nodes of the second cross coupled TIA, via the first and the second resistors, respectively, and
   the low power LNA comprises a complementary inverter-based LNA with no degeneration inductors.

* * * * *